US006590777B2

(12) United States Patent
Morino et al.

(10) Patent No.: US 6,590,777 B2
(45) Date of Patent: Jul. 8, 2003

(54) CONTROL UNIT INCORPORATING PRESSURE SENSOR

(75) Inventors: Yuichi Morino, Saitama (JP); Sumitaka Ogawa, Saitama (JP); Tomosada Anma, Tokyo (JP)

(73) Assignees: Keihin Corporation, Tokyo (JP); Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/101,351

(22) Filed: Mar. 19, 2002

(65) Prior Publication Data

US 2002/0154466 A1 Oct. 24, 2002

(30) Foreign Application Priority Data

Mar. 29, 2001 (JP) ...................................... 2001-097161

(51) Int. Cl.[7] .................................................. H05K 1/14
(52) U.S. Cl. ........................ 361/736; 439/198; 439/913
(58) Field of Search ................................ 439/76.1, 198, 439/913; 361/736, 752, 796; 73/115, 706, 708, 718, 720, 721, 726–727, 756

(56) References Cited

U.S. PATENT DOCUMENTS 4,928,530 A * 5/1990 Lehto et al. .................. 73/756
5,257,547 A * 11/1993 Boyer ......................... 73/756
5,341,684 A * 8/1994 Adams et al. ................ 73/756
5,616,521 A * 4/1997 Cook et al. ................... 438/51
5,831,165 A * 11/1998 Iwata et al. .............. 73/514.11
5,942,691 A * 8/1999 Hopkins et al. .............. 73/706
6,201,467 B1 * 3/2001 Winterer et al. .............. 338/42

FOREIGN PATENT DOCUMENTS

JP 3-122246 12/1991

* cited by examiner

*Primary Examiner*—David Martin
*Assistant Examiner*—Thanh S. Phan
(74) *Attorney, Agent, or Firm*—Merchant & Gould, P.C.

(57) ABSTRACT

A control unit incorporating a pressure sensor has a case body with an upper opening, incorporating a printed circuit board on which a pressure sensor and a plurality of control circuit components are mounted, and a lid to close the case body. A connector box extending outward is attached to one sidewall of the case body. The pressure sensor is disposed in the vicinity of the connector box. A first pressure passage is integrally formed with the lid, being opposed to the pressure sensor. A second pressure passage communicating with the first pressure passage is integrally formed with the lid, extending in the same direction as the connector box.

3 Claims, 6 Drawing Sheets

CONTROL UNIT INCORPORATING PRESSURE SENSOR

FIELD OF THE INVENTION

This invention relates to a control unit incorporating a pressure sensor mounted to a printed circuit board which is housed in the control unit.

BACKGROUND OF THE INVENTION

An example of detecting a pressure within an intake passage of a throttle body using a pressure sensor is disclosed in Japanese Utility Model Laid-Open Publication No. HEI-3-122246 entitled "Engine Intake System." This pressure sensor is shown in FIGS. 6 and 7 hereof.

FIG. 6 illustrates an electronic control unit 101 incorporated in a throttle body 100.

The throttle body 100 includes a pressure sensor 102. The pressure sensor 102 has a pressure intake port 103 communicating with a pressure chamber 104. The pressure chamber 104 communicates with an intake passage 106 via a pressure passage 105. The pressure sensor 102 detects the pressure downstream of a throttle valve 107. The electronic control unit 101 controls the operating parameters of an engine (not shown), based on information on the pressure detected by the pressure sensor 102. The incorporation of the electronic control unit 101 in the throttle body 100 allows the pressure passage 105 to be formed within the throttle body 100.

In some cases, however, the electronic control unit 101 cannot be disposed in the vicinity of the throttle body 100 because of constraints on layout, for example. An example of such a case is described with reference to FIG. 7.

FIG. 7 shows an electronic control unit 111 disposed separately from a throttle body 110.

The electronic control unit 111 has a case 112 and a printed circuit board 113 provided within the case 112. A pressure sensor 114 is mounted on the printed circuit board 113. The pressure sensor 114 is connected to a hose connection 116 via a pressure-resistant hose 115.

A pressure hose 117 is connected to the hose connection 116 provided at a front end 112*a* (right end in the figure) of the case 112. The pressure hose 117 is communicated with an intake passage 118 of the throttle body 110 (downstream from a throttle valve 118*a*). A harness 120 is connected to a connecter 119 provided at a rear end 112*b* (left end in the figure) of the case 112. The electronic control unit 111 is connected to a battery and an actuator for controlling an engine.

The pressure sensor 114 detects the pressure in the intake passage 118 downstream from the throttle valve 118*a*. Based on information on the pressure detected by the pressure sensor 114, the electronic control unit 111 controls the actuator and controls the operating parameters of the engine.

However, the necessity of connecting the pressure sensor 114 of the electronic control unit 111 to the hose connection 116 via the pressure-resistant hose 115 results in an increased number of components.

In addition, the necessity of connecting one end of the pressure-resistant hose 115 to the pressure sensor 114 and connecting the other end of the pressure-resistant hose 115 to the hose connection 116 results in time-consuming assemblage and installation of the electronic control unit 111.

The increased number of components and the time-consuming assemblage and installation have prevented cost reduction of the electronic control unit 111.

To connect the harness 120 to the connector 119 provided at the rear end 112*b* of the case 112 requires supporting the case 112 with the right hand while connecting the harness 120 to the connector 119 with the left hand.

Also, the connection of the pressure hose 117 to the hose connection 116 provided at the front end 112*a* of the case 112 requires passing the case 112 to the left hand to connect the pressure hose 117 to the hose connection 116 with the right hand.

The necessity of passing the case 112 from the left hand to the right hand for connecting the pressure hose 117 after connecting the harness 120 results in the time-consuming assemblage and installation of the electronic control unit 111.

SUMMARY OF THE INVENTION

It is therefore an object of the present invention to provide a control unit incorporating a pressure sensor with a simplified and easy-to-assemble construction.

According to an aspect of the present invention, there is provided a control unit incorporating a pressure sensor, which comprises: a case body with an opening; a printed circuit board housed in the case body; a pressure sensor mounted on the printed circuit board and having a pressure intake pipe for taking in pressure from the outside; and a lid to close the opening of the case body, wherein the pressure intake pipe extends toward the lid, and the lid is integrally provided with a first pressure passage to which the pressure intake pipe is fitted, and a second pressure passage extending from the first pressure passage to the outside.

It is thus possible in the present control unit to fit the first pressure passage to the pressure intake pipe to communicate the pressure intake pipe with the second pressure passage via the first pressure passage, by placing the lid over the case body. This eliminates the need for a conventionally-used connecting hose, reducing the number of components to provide a simplified construction and thereby reduce the cost. Also, this saves the trouble of coupling the first pressure passage and the pressure sensor with a connecting hose, resulting in simplified assemblage.

In the present control unit, the case body has a box-like shape, and a connector box provided at one wall of four sidewalls of the case body, and the second pressure passage formed with the lid are oriented in the same direction. Thus the operation of connecting a harness to the connector box and the operation of connecting a pressure hose to the second pressure passage can be done from the same direction. That is, it is possible to connect the harness to the connector box with one hand while holding the control unit with the other hand and thereafter, without changing the hand holding the control unit, to connect the pressure hose to the second pressure passage. Further, the total length of the control unit can be made shorter as compared with a case where the connector box and the second pressure passage are oriented in opposite directions. This increases the degree of freedom in mounting space and facilitates the handling of the control unit during transportation.

In the present invention, the pressure sensor is disposed in the vicinity of the connector box. The thickness of the pressure sensor is generally greater than that of other resistive elements or the like on the printed circuit board. The thickness of the connector box is also generally greater than that of a plurality of control circuit components mounted on the printed circuit board. The maximum thickness of the control unit is determined by the thickness of the pressure sensor and the connector box. Technical difficulties in molding the lid increase as the second pressure passage integrally molded with the lid becomes longer. Under these considerations, the pressure sensor is disposed in the vicinity of the connector box. Such an arrangement of the pressure sensor and the connector box as the determinants of the maximum thickness of the control unit results in only a single portion of the control unit having a relatively large thickness. This facilitates the designing of the control unit. The disposition of the pressure sensor in the vicinity of the connector box makes the first pressure passage positioned above the pressure sensor, and shortens the second pressure passage communicating with the first pressure passage and extending in the same direction as the connector box. This also reduces the diameter of the second pressure passage, resulting in reduced technical difficulties in molding the lid.

An injection opening for the injection of molding resin into the control unit is provided in a corner of the lid in the most distant position from the pressure sensor. Since the pressure sensor has a large thickness as described above, it can prevent the flow of the molding resin. To eliminate this concern, the pressure sensor is disposed in a corner and the injection opening for the molding resin is provided in another corner of the lid which is most distant from the pressure sensor. This allows the smooth flow of the molding resin within the control unit when filling the inside of the control unit with the molding resin.

BRIEF DESCRIPTION OF THE DRAWINGS

Certain preferred embodiments of the present invention will be described in detail below, by way of example only, with reference to the accompanying drawings, in which.

DETAILED DESCRIPTION OF THE PREFERRED EMBODIMENTS

Figure 1:
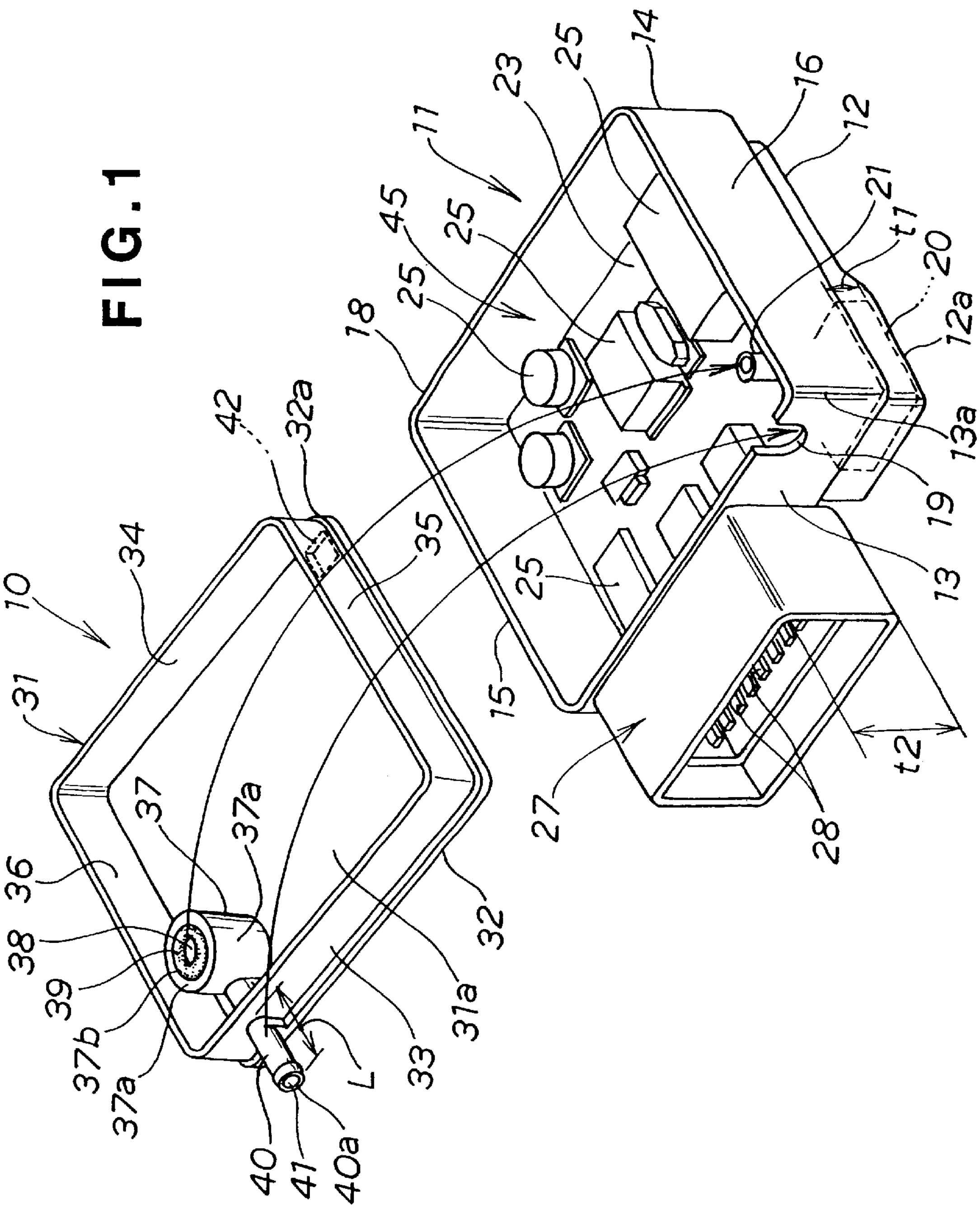
FIG. 1 is an exploded perspective view of a control unit incorporating a pressure sensor, according to a first embodiment of the present invention.
Figure 2:
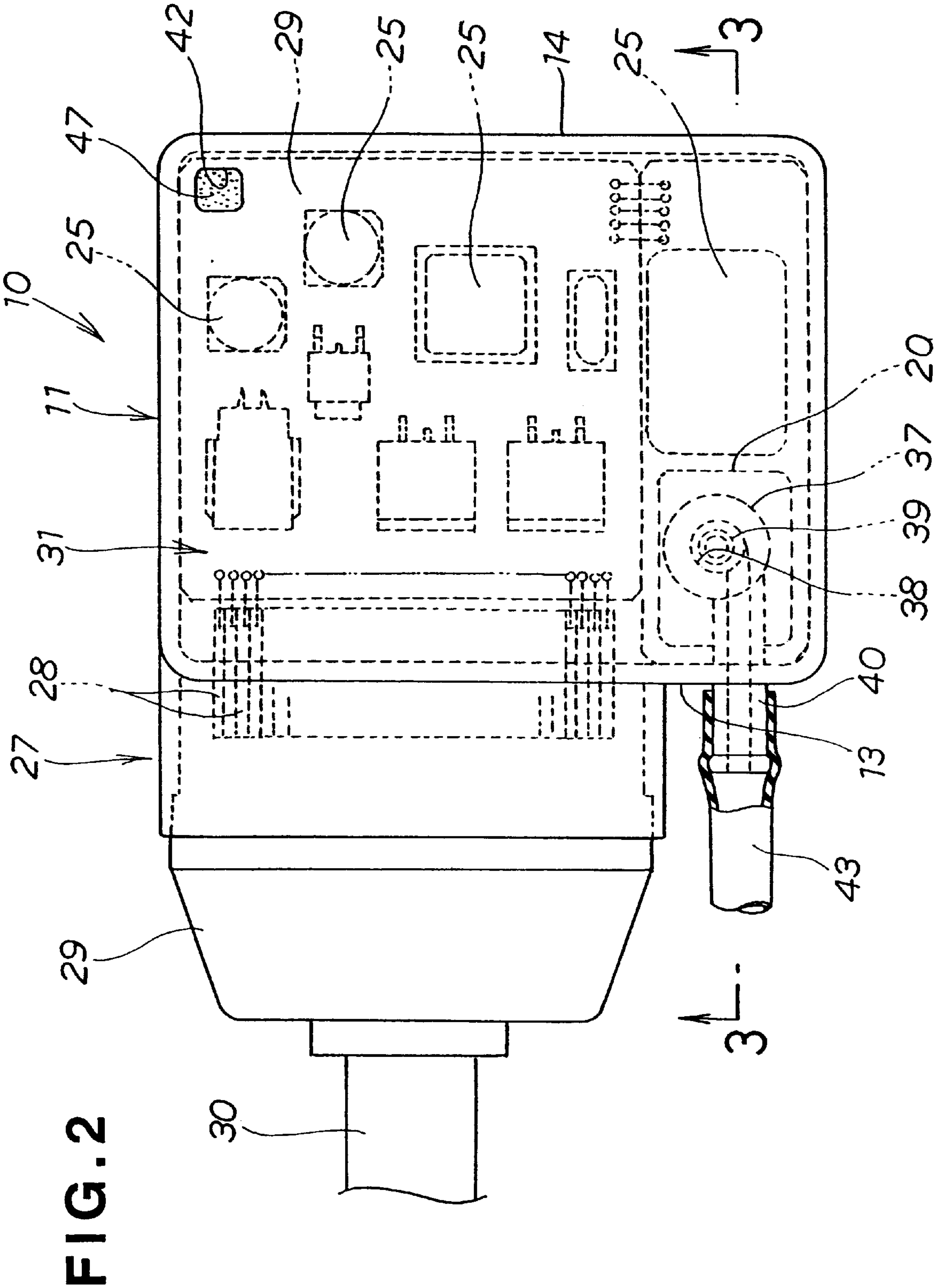
FIG. 2 is a plan view of the control unit shown in FIG. 1.
Figure 3:
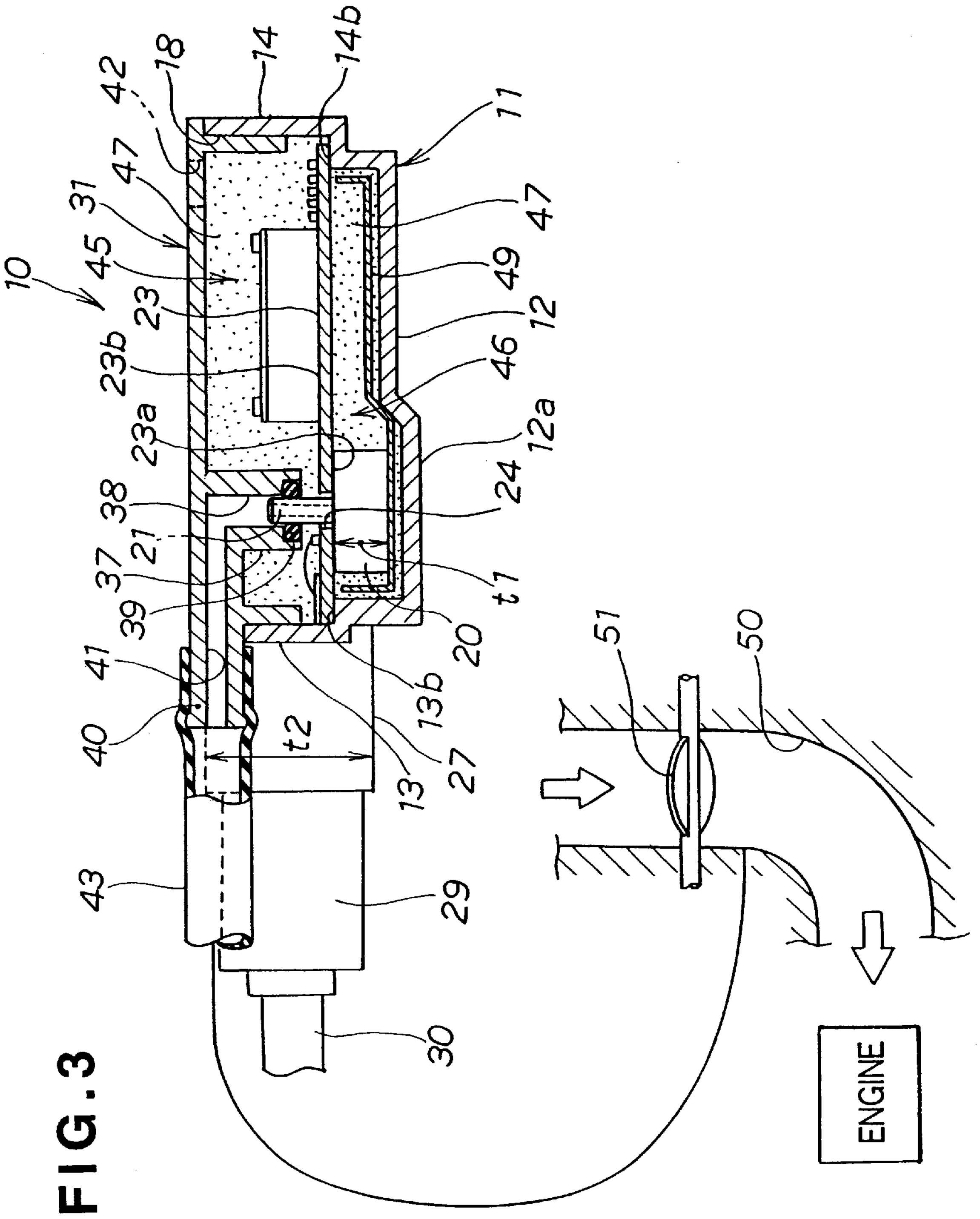
FIG. 3 is an enlarged cross-sectional view taken along line 3—3 in FIG. 2.

FIGS. 1 to 4 show a control box incorporating a pressure sensor, according to a first embodiment of the present invention. FIG. 1 illustrates a control unit 10 before being filled inside with molding resin 47 as shown in FIG. 3.

The control unit 10 has a case body 11 in a box-like shape having an opening 18 at the top, and a lid 31 for covering the opening 18. A printed circuit board 23 is housed in the case body 11. A pressure sensor 20 and a plurality of control circuit components 25 with a CPU as the main component are mounted on the printed circuit board 23.

The pressure sensor 20 has a pressure intake pipe 21. The pressure intake pipe 21 extends toward the lid 31. A boss 37 is integrally formed on an internal surface 31*a* of the lid 31 in a position opposite to the pressure intake pipe 21. The boss 37 is formed with a first pressure passage 38 for receiving the pressure intake pipe 21. A pressure duct 40 with a second pressure passage 41 formed therein is integrally formed with the boss 37, and extends outside the control unit 10. The first and second pressure passages 38 and 41 communicate with one another. When the opening 18 is closed by the lid 31, the first pressure passage 38 is fitted onto the pressure intake pipe 21 as shown by an arrow.

A connector box 27 including a plurality of connection terminals 28 is attached to a front wall 13 of four sidewalls 13 to 16 of the case body 11. The connector box 27 is of a rectangular hollow body.

The front wall 13 of the case body 11 has a notch 19 provided in the vicinity of a corner 13*a* formed between the front and left sidewalls 13 and 16. The pressure duct 40 is fitted into the notch 19 when the lid 31 is placed over the case body 11. The notch 19 is U-shaped and has a width slightly greater than the outside diameter of the pressure duct 40.

The walls 13 to 16 have respective steps provided inside. FIG. 3 shows such steps 13*b* and 14*b* (steps in the left and right sidewalls 15 and 16 not shown). The printed circuit board 23 is mounted on the steps. An upper space 45 and a lower space 46 are thus defined with the board 23 interposed therebetween.

A bottom plate 12 has a protruding portion 12*a* extending downward in the vicinity of the corner 13*a* as shown in FIG. 3. The provision of the protruding portion 12*a* enlarges the lower space 46 of the case body 11 in proportion to the protruding portion 12*a*. The pressure sensor 20 mounted on the rear surface of the printed circuit board 23 is accommodated in the enlarged space.

The lid 31 has a lid plate 32 of a rectangular shape. The lid plate 32 is integrally provided at its four side portions with engaging frame parts 33, 34, 35 and 36 for preventing the dislocation of the lid 31 when the lid 31 is fitted to the case body 11. The frame parts 33 to 36 are fitted into the case body 11 to close the opening 18 with the lid 31. The lid 31 is thus mounted onto the case body 11 while being disposed in place.

The boss 37 is provided on the lid plate 32 in the vicinity of a corner at which the front and left frame parts 33 and 36 of the lid plate 32 intersect one another. The boss 37 is provided with a passageway which constitutes the first pressure passage 38. A groove 37*b* is provided in an end portion 37*a* of the boss 37. An O-ring 39 is fitted into the groove 37*b*.

The boss 37 and the pressure duct 40 are integrally formed with one another. The first pressure passage 38 and the second pressure passage 41 communicate with one another, forming the letter L as shown in FIG. 3. A front portion 40*a* of the pressure duct 40 protrudes from the frame part 33 of the lid 31 by a length L.

In a corner 32*a* of the lid plate 32 diagonally opposite to the boss 37 is provided an injection opening 42 for injecting the molding resin 47 shown in FIG. 3 into the upper space 45 of the control unit 10. The molding resin injection opening 42 provided in the corner 32*a* is thus in the most distant position from the pressure sensor 20 and the boss 37 positioned above the sensor 20. When the upper space 45 of the control unit 10 is filled with the molding resin 47, the boss 37 thus does not obstruct the flow of the molding resin 47. The molding resin 47 flows smoothly into the upper space 45, filling the space 45 in a relatively short time.

The plurality of connecting terminals 28 in the connector box 27 are connected to a battery, and outputs control signals from the plurality of control circuit components which have processed detection signals from the pressure sensor 20 and other kinds of sensors. The operating parameters of the engine, for example, are controlled by the control signals.

The pressure sensor 20 is disposed in the vicinity of the connector box 27. As shown in FIG. 3, the pressure sensor 20 has a thickness t1 greater than that of any of the control circuit components 25 mounted on the printed circuit board 23. The connector box 27 also has a thickness t2 greater than that of any of the control circuit components 25. The maximum thickness of the control unit 10 is thus determined by the thickness of the pressure sensor 20 and the connector box 27.

Arranging the pressure sensor 20 and the connector box 27, determinants of the maximum thickness of the control unit 10, on one side of the case body 11 results in thicker portions of the entire control unit 10 arranged in a single place, facilitating the designing of the control unit 10. Specifically, the control unit 10 can be reduced in internal volume, and the weight-saving designing of the control unit 10 is facilitated.

Since the pressure sensor 20 is disposed in the vicinity of the connector box 27, the pressure duct 40 having the second pressure passage 41 which communicates with the first pressure passage 38 positioned above the pressure sensor 20 has a length shorter than in a case where the pressure sensor 20 is disposed in a more distant position from the connector box 27. The short length of the duct 40 allows for a small diameter thereof. This simplifies the configuration of a metal mold for molding the lid 31 with which the duct 40 is integrally molded, resulting in the reduced cost of the lid 31.

In addition, the arrangement of the pressure sensor 20 and the connector box 27 in a single place allows the upper space 45 of the control unit 10 to be one large space. That is, for example, if the pressure sensor 20 were disposed in the most distant position from the connector box 27, the pressure duct 40 would extend across the upper space 45, making the upper space 45 smaller by its volume. The present arrangement further allows the smooth flow of the molding resin 47 to be maintained when filling the upper space 45 of the control unit 10.

FIG. 2 shows a plan view of the control unit according to the first embodiment of the present invention. The connector box 27 is attached to the front wall 13 of the case body 11. A plug 29 is fitted into the connector box 27 to connect the connection terminals 28 to the harness 30. As a result, the plurality of control circuit components 25 mounted on the printed circuit board 23 are connected to the harness 30. A pressure hose 43 is connected to the pressure duct 40 integrally formed with the front wall 13.

Since the connector box 27 and the pressure duct 40 are provided at the front wall 13 of the case body 11, extending in the same direction, the total length of the control unit 10 can be kept shorter than in a case where those components 27 and 40 are individually provided at the opposite walls (the front wall 13 and the rear wall 14) of the control unit 10, respectively, and also the handling of the control unit 10 during transportation is facilitated. Further, the operation of connecting the harness 30 to the connector box 27 and the operation of connecting the pressure hose 43 to the pressure duct 40 can be done from one side of the control unit 10. That is, after connecting the harness 30 to the connector box 27 with one hand while holding the control unit 10 with the other hand, the operator can connect the pressure hose 43 to the pressure duct 40 without changing the hand holding the connector box 27. This facilitates the assemblage of the control unit 10.

In FIG. 3, by mounting the pressure sensor 20 on a rear surface 23*a* of the printed circuit board 23, the pressure intake pipe 21 protrudes from an insertion hole 24 provided in the board 23 in the direction of a top surface 23*b* of the board 23, extending toward the lid 31. When the lid 31 is fitted onto the case body 11, the first pressure passage 38 of the lid 31 is thus fitted onto the pressure intake pipe 21. The O-ring 39 provided in the boss 37 seals the gap between the first pressure passage 38 and the pressure intake pipe 21. This eliminates the need for a connecting hose conventionally used for the connection between the pressure intake pipe 21 of the pressure sensor 20 and the first pressure passage 38. The reduced number of components saves the conventional trouble of connecting the connecting hose, facilitating assemblage and reducing cost.

The lower space 46 defined by the bottom plate 12 of the case body 11 and the printed circuit board 23 is filled with the molding resin 47. Filling the upper space 45 defined by the printed circuit board 23 and the lid 31 with the molding resin 47 improves water and vibration resistance.

The control unit 10 has an electromagnetic shield plate 49 provided along the bottom plate 12 of the case body 11 so as to cover the pressure sensor 20 with the shield plate 49. The pressure sensor 20 and other components on the printed circuit board 23 covered by the electromagnetic shield plate 49 are thus protected from being affected by electromagnetism produced outside the control unit 10.

In the control unit 10, the pressure hose 43 is connected to the pressure duct 40 so as to communicate the pressure intake pipe 21 of the pressure sensor 20 with the inside of an intake passage 50 of an engine (downstream from a butterfly valve 51). The pressure sensor 20 detects the intake pressure within the intake passage 50 downstream from the butterfly valve 51. Arrows in the intake passage 50 indicate the direction of air flow.

Now the assembly process of the control unit 10 incorporating the pressure sensor 20 according to the present invention is described with reference to FIGS. 4A to 4C.

Figure 4A:
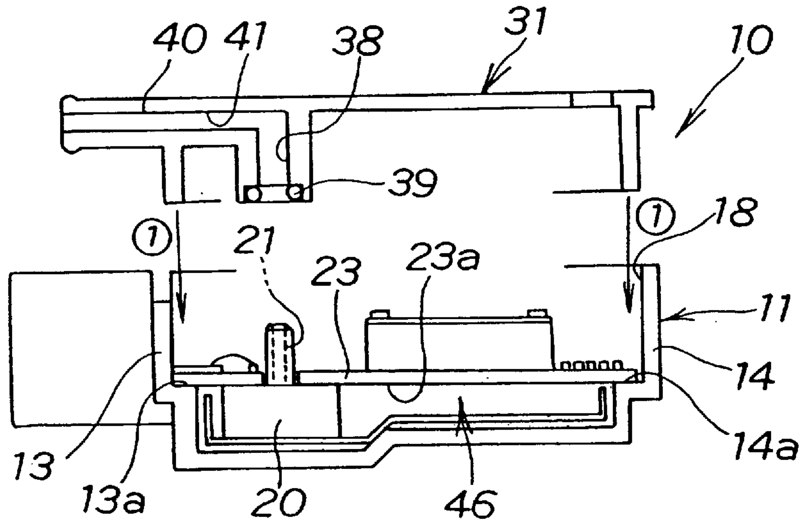
FIGS. 4A to 4C are diagrams illustrating the assembling process of the control unit according to the first embodiment.

In FIG. 4A, the printed circuit board 23 with the pressure sensor 20 mounted thereon is inserted from the opening 18 of the case body 11 into the body 11 and mounted on the steps 13*b* and 14*b* of the front and rear walls 13 and 14. The lid 31 is placed over the opening 18 of the case body 11 as shown by arrows ①.

Figure 4B:
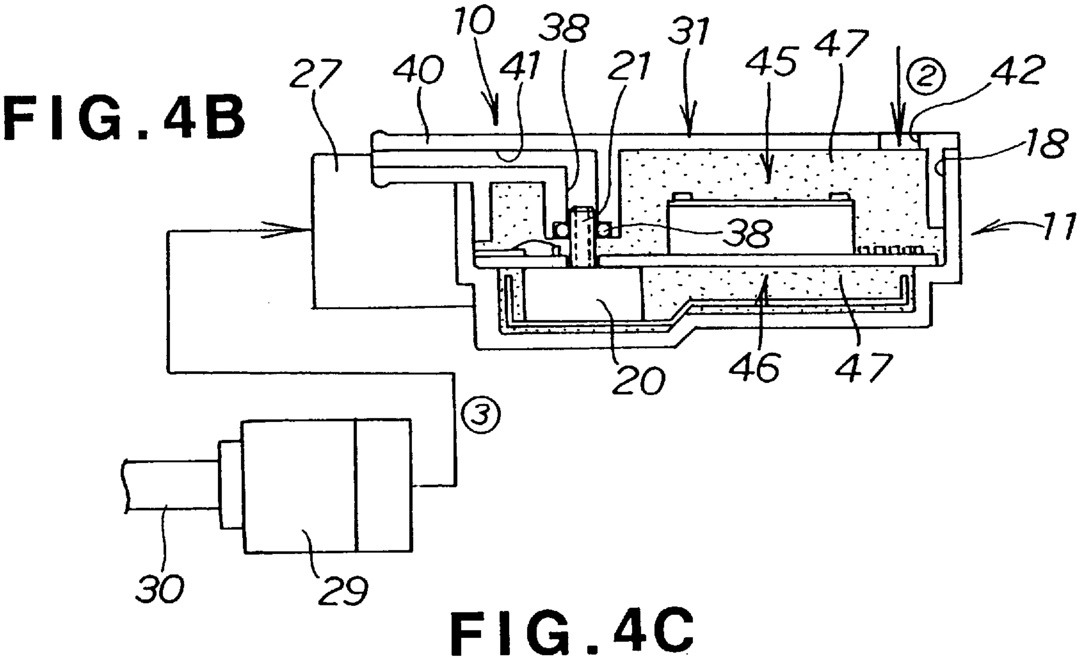

In FIG. 4B, with the lid 31 placed over the opening 18 of the case body 11, the pressure intake pipe 21 of the pressure sensor 20 is fitted into the first pressure passage 38 of the lid 31. The molding resin 47 is injected from the molding resin injection opening 42 into the upper space 45 as shown by an arrow ②, filling the space 45. The molding resin 47 passes through the gap between the case body 11 and the printed circuit board 23 into the lower space 46 of the case body 11, filling the space 46.

Then the control unit 10 is held with one hand, the left hand, for example, and the plug 29 is held with the other hand, the right hand, and inserted into the connector box 27 as shown by an arrow ③. This establishes the connection between the connection terminals 28 and the harness 30.

Figure 4C:
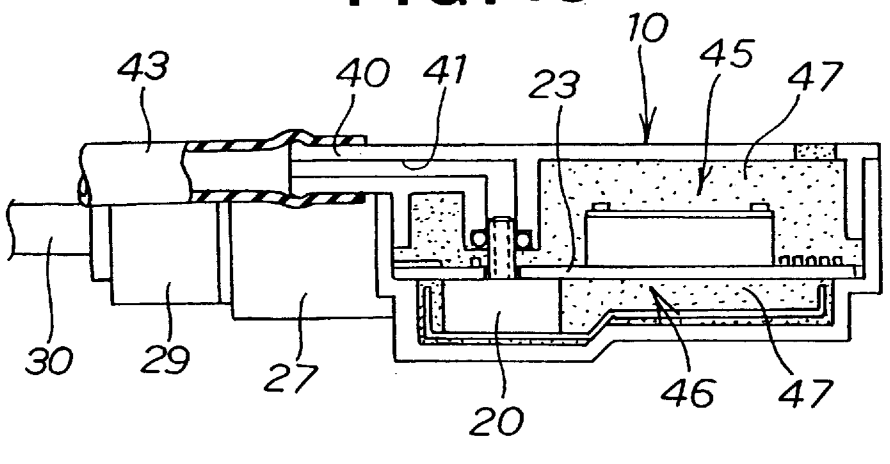

In FIG. 4C, the control unit 10 is still held with the left hand, and the pressure hose 43 is held with the right hand and connected to the pressure duct 40. Since the connector box 27 and the pressure duct 40 are provided at one side of the control unit, extending in the same direction, the operator can perform the connecting operations of both the harness 30 and the pressure hose 43 while holding the control unit with the left hand. That is, this eliminates the need for passing the control unit 10 between the left and right hands during these operations, facilitating the installation of the control unit 10 in a vehicle.

Figure 5:
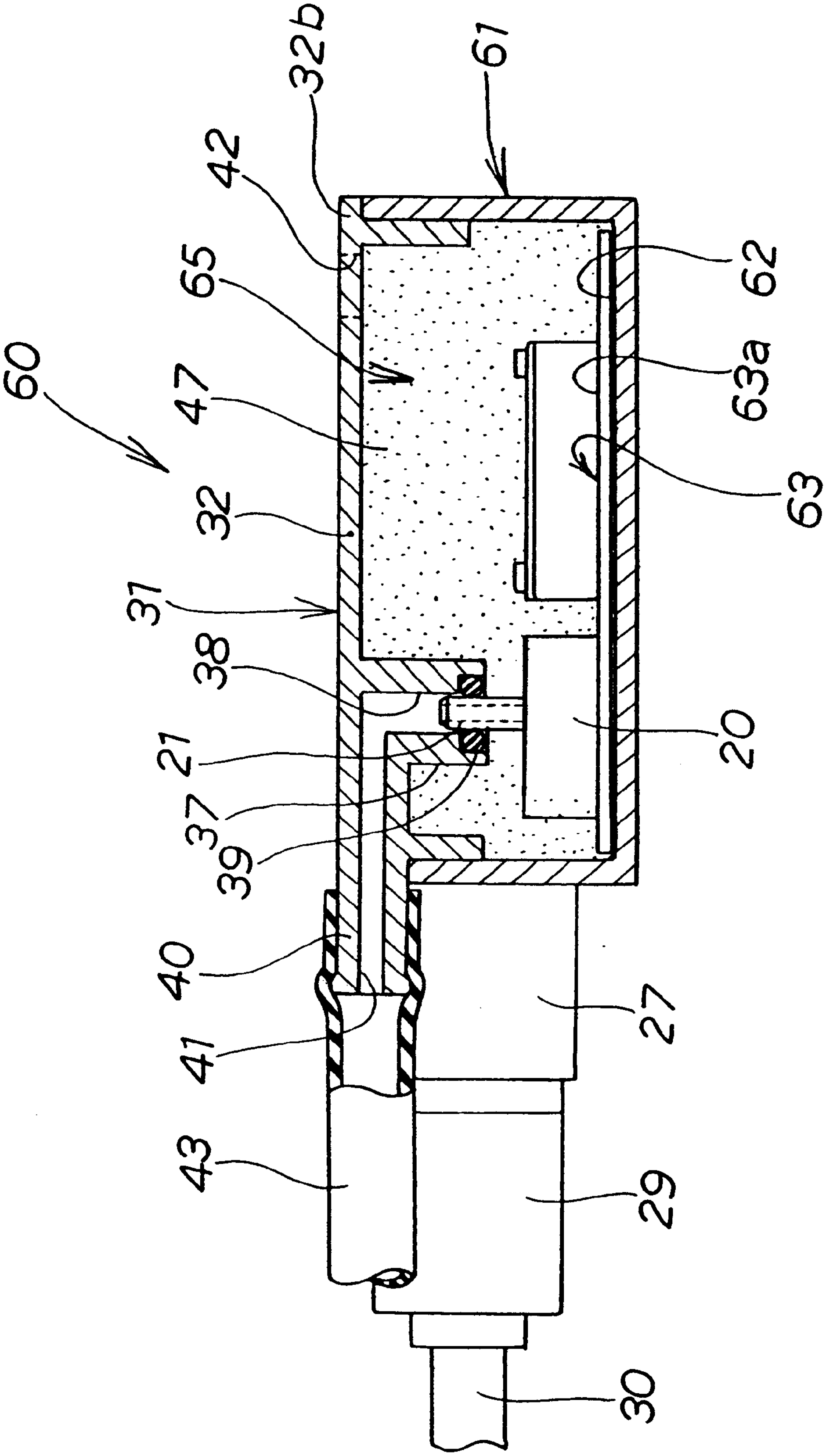
FIG. 5 is a cross-sectional view of a control unit incorporating a pressure sensor, according to a second embodiment of the present invention.
Figure 6:
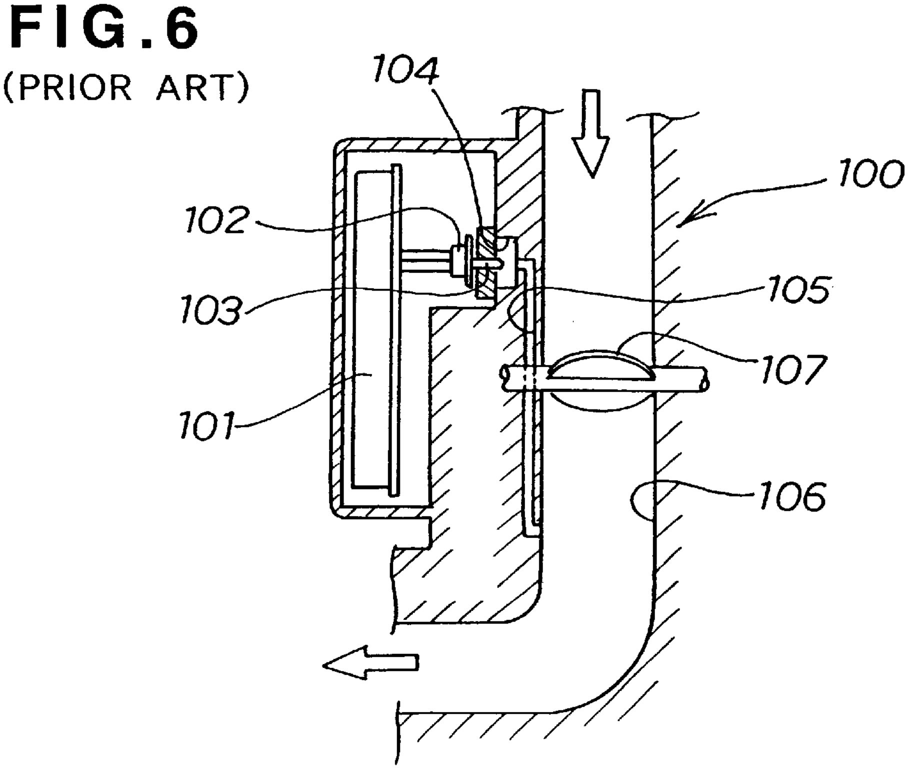
FIG.6 (PRIOR ART)
FIG. 6 is a diagram illustrating a sensing system for detecting the pressure within an intake passage, the sensing system being incorporated into a throttle body in a conventional manner.
Figure 7:
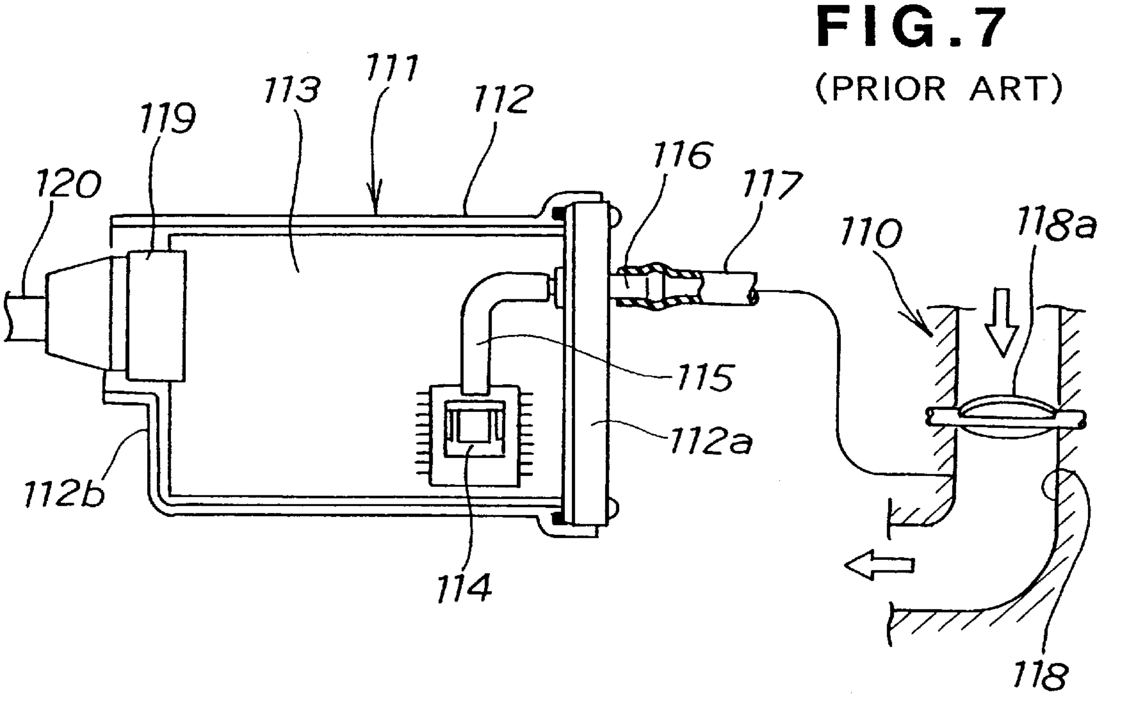
FIG.7 (PRIOR ART)
FIG. 7 is a diagram illustrating a sensing system for detecting the pressure within an intake passage, the sensing system being separate from a throttle body in a conventional manner.

Now a control unit according to a second embodiment is described with reference to FIG. 5. In FIG. 5, components identical with those in the first embodiment are denoted by the same reference numerals to avoid redundancy in description.

A control unit 60 according to the second embodiment is different from the control unit 10 according to the first embodiment in that a pressure sensor 20 is mounted on a top surface 63*a* of a printed circuit board 63 and the board 63 is disposed on a bottom surface 62 of a case body 61. Other components are constructed the same as in the first embodiment and provide effects similar to those in the control unit 10 according to the first embodiment.

Disposing the printed circuit board 63 on the bottom surface 62 of the case body 61 results in a single inner space 65 within the case body 61. Thus the space within the case body 11 is not divided into upper and lower spaces 45 and 46, unlike the first embodiment (See FIG. 3). This further facilitates the operation of filling with molding resin 47.

A molding resin injection opening 42 is provided in a rear right corner 32*a* of a lid 32 to dispose it in the most distant position from the pressure sensor 20. When the molding resin 47 is injected into the inner space 65 of the control unit 61, the pressure sensor 20 and a boss 37 thus do not obstruct the flow of the molding resin 47. This maintains the smooth flow of the molding resin. Thus it takes a relatively short time to fill the inner space 65 of the control unit 61 with the molding resin 47.

The first and second embodiments illustrate the openings 18 provided in the top surfaces of the case bodies 11 and 61. It is also possible to provide an opening in a bottom surface of the case body 11 or 61. In such a construction, providing molding resin injection opening 42 in a lid 31 which closes the opening and providing a molding resin passage in the printed circuit board 23 or 63 opposite to the molding resin injection opening 42 allow the smooth flow of the molding resin from the lower space 46 into the upper space 45 in the case body 11 or the smooth flow of the molding resin from the bottom surface into the inner space 65 in the case body 61.

The present disclosure relates to the subject matter of Japanese Patent Application No. 2001-097161, filed Mar. 29, 2001, the disclosure of which is incorporated herein by reference in its entirety.

What is claimed is:

1. A control unit incorporating a pressure sensor, comprising:

a case body with an opening, said case body having a box-like shape with four walls, said case box further having a connector box extending from one of the four walls;

a printed circuit board housed in said case body;

a pressure sensor mounted on said printed circuit board and having a pressure intake pipe for taking in pressure from the outside; and a lid for closing said opening of said case body, said pressure intake pipe extending toward said lid, said lid being integrally provided with a first pressure passage to which said pressure intake pipe is fitted and a second pressure passage extending from said first pressure passage through said one at the four walls of said case body to the outside, wherein said connector box and said second pressure passage formed fanned with said lid extend from said one of the four walls in the same direction.

2. A control unit as set forth in claim 1, wherein said pressure sensor is disposed in the vicinity of said connector box.

3. A control unit as set forth in claim 1, wherein an injection opening for the injection of molding resin is provided in a corner of said lid in the most distant position from said pressure sensor.

* * * * *